Figure 1:
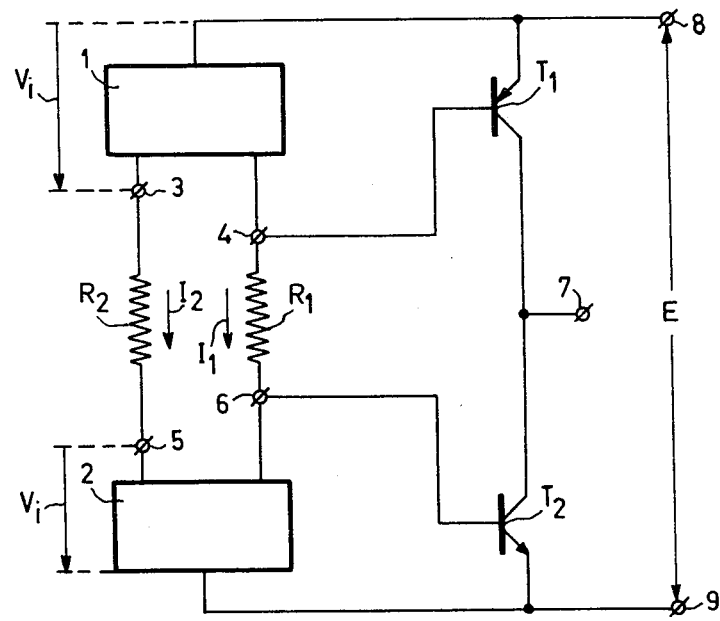

United States Patent [19]

Thommen

[11] 3,997,849
[45] Dec. 14, 1976

[54] PUSH-PULL AMPLIFIER

[75] Inventor: Werner Felix Thommen, Hausen, Switzerland

[73] Assignee: U.S. Philips Corporation, New York, N.Y.

[22] Filed: July 17, 1975

[21] Appl. No.: 596,662

[30] Foreign Application Priority Data

July 26, 1974 Netherlands ................... 7410080

[52] U.S. Cl. ................................. 330/13; 330/15; 330/22; 330/28; 330/40
[51] Int. Cl.² ...................................... H03F 3/183
[58] Field of Search ................ 330/13, 15, 22, 40, 330/38 M, 28

[56] References Cited

UNITED STATES PATENTS

| | | | |
|---|---|---|---|
| 3,697,882 | 12/1972 | Van Den Platsche | 330/15 |
| 3,863,169 | 1/1975 | Knight | 330/22 |

*Primary Examiner*—James B. Mullins
*Attorney, Agent, or Firm*—Frank R. Trifari; Bernard Franzblau

[57] ABSTRACT

A push-pull amplifier consisting of a complementary pair of output transistors whose bases are interconnected by a resistor. According to the invention, the bases are separately connected to the outputs of two current mirrors whose inputs are interconnected via a second resistor. A relation is then obtained between the values of the two resistors for which the quiescent current through the output transistors is supply-voltage independent in a first-order approximation.

10 Claims, 3 Drawing Figures

PUSH-PULL AMPLIFIER

The invention relates to a push-pull amplifier which comprises a first and a second transistor of mutually opposite conductivity types and whose collector-emitter paths are connected in series between the terminals of a supply source. An output terminal is connected to the facing collectors of the first and the second transistor. A first resistor interconnects the bases of the first and the second transistor, and a quiescent current control circuit feeds a quiescent current through the first resistor so that the quiescent current through the first and the second transistor is determined by the quiescent current control circuit.

Such push-pull amplifiers are employed as output amplifiers in hearing aids. A problem associated therewith is that the voltage of the batteries which power the amplifier decreases long before the batteries are exhausted.

In the known push-pull amplifiers the quiescent current setting is obtained in that said resistor is both connected via a current source or a resistor to the one terminal of the supply source, and via a second current source, which carriers the same current, or a similar resistor, to the other terminal of the supply source. As a result, the base-emitter voltage of the first and of the second transistor is proportional to the supply voltage. As the current which flows through the collector-emitter path of a transistor increases exponentially with the base-emitter voltage, the quiescent current setting of the known circuit arrangements are very dependent on the supply-voltage and moreover are temperature-dependent because of the temperature dependence of the transistor base-emitter voltage. In order to prevent the quiescent current through the first and the second transistor from becoming impermissibly high at maximum battery voltage and maximum temperature, said circuit arrangements must be proportioned so that at the nominal battery voltage only a small quiescent current flows, which may give rise to high distortion of the signal to be amplified. Moreover, the exponential increase of the quiescent current for an increasing battery voltage results in the maximum permissible battery voltage being only slightly higher than the nominal battery voltage.

It is an object of the invention to provide a push-pull amplifier in which said drawbacks are mitigated.

Therefore, the invention is characterized in that the quiescent current control circuit comprises a first and a second current mirror circuit each having at least one input and one output circuit, the current which flows in the output circuit being in a fixed ratio to the current which flows in the input circuit because at least one semiconductor junction in the output circuit is shunted by at least one semiconductor junction in the input circuit, to which input circuits a bias current varying with the supply voltage is applied by means of a current branch which is included between the supply terminals. Said current branch comprises at least a second resistor and the semiconductor junctions of the input circuits of the current mirror circuits. The current mirror output circuits are interconnected via the first resistor so that the quiescent current through the first resistor varies with the supply voltage in a similar way to the current through said branch. The value of the first resistor is selected so that, depending on the elements included in said branch, the quiescent currents through the first and the second transistor vary with the supply voltage to a smaller extent.

The invention is based on the recognition that owing to the use of the circuit arrangement according to the invention the base-emitter bias voltages of the first and the second transistor are not, or only slightly, dependent on the supply voltage. Moreover said bias voltages have the same temperature dependence as the base-emitter voltages which are necessary for a constant emitter current of the first and second transistors.

Figure 2:
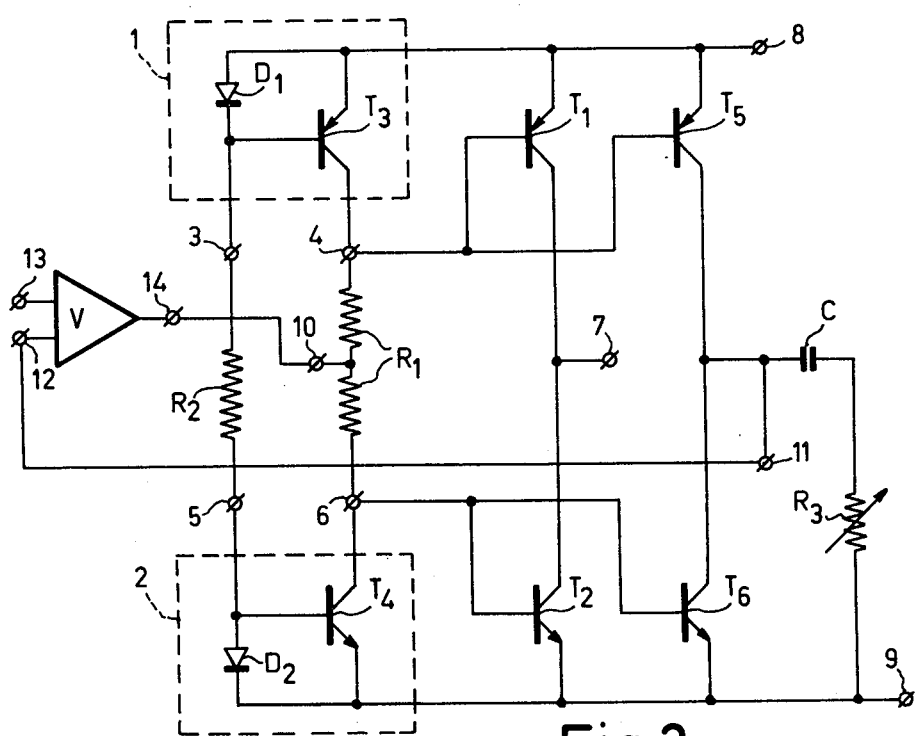
Figure 3:
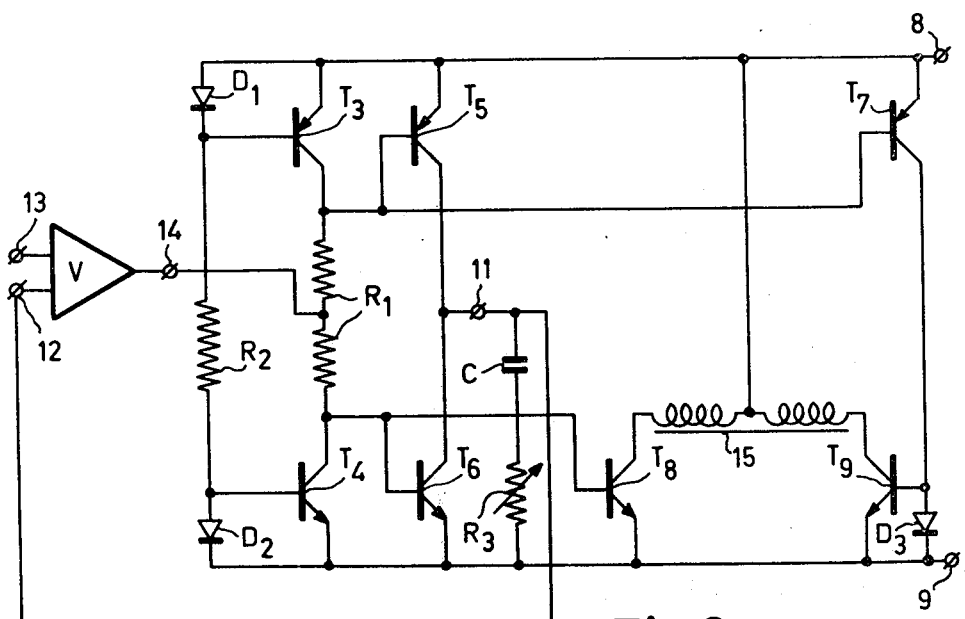

The invention will be described in more detail with reference to the drawing, in which:

FIG. 1 schematically shows a push-pull amplifier according to the invention,

FIG. 2 shows a first embodiment of a push-pull amplifier according to the invention, and FIG. 3 represents a second embodiment of a push-pull amplifier according to the invention.

FIG. 1 schematically shows a push-pull amplifier according to the invention. Between the terminals 8 and 9 of a supply source having a terminal voltage E, the series connection of the collector-emitter paths of two transistors $T_1$ and $T_2$ of mutually opposite conductivity types is included. The emitter of the pnp transistor $T_1$ is connected to the positive supply terminal 8 and the emitter of the npn transistor $T_2$ is connected to the negative supply terminal 9. The collectors of the transistors $T_1$ and $T_2$ are connected to an output terminal 7, which leads to a load, for example an earphone. Between the bases of the transistors $T_1$ and $T_2$ a first resistor $R_1$ is included. The amplifier further comprises two current mirror circuits 1 and 2 whose input terminals, which are designated by the reference numerals 3 and 5 respectively, are connected via a second resistor $R_2$. The output terminal 4 of the current mirror circuit 1 is connected to the base of transistor $T_1$ and the output terminal 6 of the current mirror circuit 2 is connected to the base of transistor $T_2$. The output circuits of the current mirror circuits 1 and 2 connect the output terminals 4 and 6 to the supply terminals 8 and 9 respectively, and similarly the input circuits connect the input terminals 3 and 5 to the supply terminals 8 and 9 respectively.

The output currents $I_1$ of the current mirror circuits 1 and 2 are in a fixed ratio n to the input currents $I_2$. When the two current mirror circuits 1 and 2 are assumed to be identical, the voltage drop across the input circuits of each of the current mirror circuits will equal $V_i$. The voltage drop across the output circuits of the current mirror circuits 1 and 2 equals the base-emitter voltage of the transistors $T_1$ and $T_2$ respectively. The input currents $I_2$ of the two current mirror circuits 1 and 2 is determined by the resistor $R_2$ and the voltage drop across it, which equals the supply voltage E minus the voltage drop $2V_i$ across the two input circuits. The sum of the base-emitter voltages of the transistors $T_1$ and $T_2$ equals the supply voltage E minus the voltage drop $I_1R_1$ across the resistor $R_1$, the base currents of the transistors $T_1$ and $T_2$ being negigible relative to the current $I_1$. When allowance is made for the ratio n between the output and the input currents of the current mirror circuits 1 and 2, the sum of the base-emitter voltages of the transistors $T_1$ and $T_2$ equals:

$$I_2(R_2 - nR_1) + 2V_i \tag{1}$$

Said expression is independent of the supply voltage E when the first derivative of expression (1), as a function of the supply voltage, equals zero. For the resistors $R_1$ and $R_2$ this yields the requirement that:

$$nR_1 = R_2 + 2R_d \qquad (2)$$

where $R_d$ is the differential input impedance of each of the current mirror circuits 1 and 2. By a suitable choice of the current mirror circuits and the resistors $R_1$ and $R_2$, taking into account requirement (2), a voltage drop can be obtained across the resistor $R_1$ such that the quiescent current through the transistors $T_1$ and $T_2$ will have the desired value. Both a class B and a class AB bias are then possible.

As in expression (2) the differential input impedance $R_d$ varies with the supply voltage to a smaller extent, complete supply voltage independence of the quiescent current setting can never be achieved with a fixed value of the resistors $R_1$ and $R_2$. Therefore, in practice, a value must be chosen for $R_d$ which corresponds to the average battery voltage. For $n = 1$ an optimum choice appears to be found when $R_1$ is approximately 20% greater than $R_2$.

FIG. 2 shows a first embodiment of a push-pull amplifier according to the invention. This embodiment is based on FIG. 1 and therefore the designations of the various corresponding parts are the same. The output circuits of the current mirror circuits 1 and 2 include the collector-emitter paths of the pnp-transistor $T_3$ and the npn-transistor $T_4$ respectively, of which the collectors are connected to the output terminals 4 and 6 respectively and the emitters to the supply terminals 8 and 9 respectively. The base-emitter junctions of the transistors $T_3$ and $T_4$ are shunted by the diodes $D_1$ and $D_2$, which in integrated circuits will generally take the form of transistors whose collector and base electrodes are interconnected. The diodes $D_1$ and $D_2$ connect the supply terminals 8 and 9 to the input terminals 3 and 5 respectively and thus constitute the input circuits of the current mirror circuits 1 and 2 respectively. A signal input terminal 10 is connected to the centre tapping of the resistor $R_1$.

With respect to the supply voltage independence of the quiescent-current setting, the resistors $R_1$ and $R_2$ should comply with requirement (2). The differential resistance $R_d$ then equals the differential resistance of a diode which carries a current $I_1$. When the diodes $D_1$ and $D_2$ consist of transistors which are connected as diodes and which are idential to the transistors $T_3$ and $T_4$ respectively, the ratio n of the output and the input currents of the current mirror circuits will equal 1. If, moreover, the differential resistances of the diodes $D_1$ and $D_2$ are low relative to the value of the resistor $R_2$, the base-emitter voltage of transistor $T_1$ and transistor $T_2$ respectively in the absence of an input signal at the input terminal 10 will only be slightly smaller than the voltage drop across the diode $D_1$ and the diode $D_2$ respectively. By an appropriate choice of the current $I_2$ which flows through the input circuits of the current mirror circuits 1 and 2, the desired quiescent current setting for the transistors $T_1$ and $T_2$ is obtained.

When an input signal current is applied to the input terminal 10, said signal current is distributed among the base electrodes of the transistors $T_1$ and $T_2$ because the input impedances of the transistors $T_1$ and $T_2$ are low relative to the input impedances of the output circuits of the current mirror circuits 1 and 2. The amplified signal current which flows through the output terminal 7 may then be several times greater than the quiescent current through the transistors $T_1$ and $T_2$, for example for a class-AB bias.

In principle, it is possible to apply the input signal to a centre tapping of the resistor $R_2$. The input signal current is then distributed among the input circuits of the current mirror circuits 1 and 2. Owing to the fixed ratio between the input and the output currents of the current mirror circuits 1 and 2, the output circuits of the two current mirror circuits 1 and 2 also carry the signal currents, which signal currents are distributed among the base electrodes of the transistors $T_1$ and $T_2$. A drawback of this arrangement is that the input impedance at the centre tapping of the resistor $R_2$ is substantially lower than the input impedance at the centre tapping of the resistor $R_1$ owing to the low input impedances of the current mirror circuits 1 and 2. However, in specific applications it may be advantageous to have the current mirror circuits 1 and 2 carry signal currents, so that by extending the current mirror circuits 1 and 2 with a second output circuit, an additional output signal can be obtained.

Push-pull amplifiers practically always employ negative feedback. When, as a negative feedback signal, a voltage is required which is proportional to the output voltage, the negative-feedback signal can be taken from the output terminal 7. If a negative-feedback signal which is proportional to the current through the transistors $T_1$ and $T_2$ is required, which may for example be desirable in the case of frequency-dependent loads, use can be made of an additional output in accordance with FIG. 2.

In order to obtain said additional output, the base of transistor $T_1$ is connected to the base of a pnp transistor $T_5$ and the base of transistor $T_2$ to the base of an npn-transistor $T_6$. The collectors of the transistors $T_5$ and $T_6$ are connected to a second output terminal 11, which is moreover connected to the negative supply terminal 9 via the series connection of a decoupling capacitor C and a variable resistor $R_3$. Through the output terminal 11 a current is then obtained which is proportional to the current which flows through the output terminal 7. Said current causes a voltage drop across the resistor $R_3$ which is also proportional to the current which flows through the output terminal 7. Said voltage is applied to a first input terminal 12 of a preamplifier V whose output terminal 14 is connected to the input terminal 10. An input signal can be applied to a second input terminal 13 of the preamplifier V. The signal voltage at output terminal 11, to be fed back to the preamplifier V, can be adjusted with the aid of the variable resistor $R_3$ so that a volume control is obtained. The transistors $T_5$ and $T_6$ are generally proportioned so that they carry only a fraction of the current which flows through the transistors $T_1$ and $T_2$. This can be effected by selecting the base-emitter areas of the transistors $T_5$ and $T_6$ to be much smaller than the base-emitter areas of the transistors $T_1$ and $T_2$.

An additional advantage of the use, according to the invention, of two current mirror circuits for the quiescent-current setting is the reduction of the temperature dependence of the quiescent-current setting. When the temperature rises, the current $I_2$ through the input circuits of the current mirror circuits 1 and 2 will increase owing to the temperature-dependence of the diode characteristics of the diodes $D_1$ and $D_2$. The base-emitter junctions of the transistors $T_1$, $T_2$, $T_5$ and $T_6$ have a similar temperature-dependence so that the increase of the quiescent currents through said transistors is more or less compensated for by the decrease of the base-emitter voltage of said transistors owing to the voltage across the resistor $R_1$ which increases with the temperature.

In the embodiment of FIG. 2 the input circuits of the current mirror circuits 1 and 2 are directly coupled via a resistor $R_2$. It is to be noted that in principle a more intricate embodiment is possible. For example, the input terminal 3 of the current mirror circuit 1 may be connected to the supply terminal 9 via the resistor $R_2$ and the input circuit of a third current mirror circuit. The output circuit of said third current mirror circuit is then connected to the supply terminal 8 via the input circuit of a fourth current mirror circuit, the output circuit of said fourth current-mirror circuit being connected to the input terminal 5 of the current mirror circuit 2.

The quiescent current setting according to the invention may also be employed in output amplifiers of hearing-aids with earphones with a centre tapping, which are used in hearing aids with a comparatively high output power.

FIG. 3 shows such an output amplifier. This amplifier comprises the amplifier of FIG. 2 except for the transistors $T_1$ and $T_2$. The base of transistor $T_5$ is connected to the base of a pnp-transistor $T_7$, whose emitter is connected to the positive supply terminal 8 and whose collector is connected to the negative supply terminal 9 via a diode $D_3$. The diode $D_3$ is shunted by the base-emitter junction of an npn-transistor $T_9$. The base emitter junction of transistor $T_6$ is shunted by the base-emitter junction of an npn-transistor $T_8$. The collectors of the transistors $T_8$ and $T_9$ are connected by the energizing coil 15 of an earphone, a centre tapping of said energizing coil being connected to the positive supply terminal 8.

As the base-emitter junctions of the transistors $T_5$ and $T_7$ as well as those of the transistors $T_6$ and $T_8$ are connected in parallel, currents will flow through the collector-emitter paths of the transistors $T_7$ and $T_8$, which currents are proportional to the currents which flow through the collector-emitter paths of the transistors $T_5$ and $T_6$ respectively. The collector current of transistor $T_7$ then flows through the diode $D_3$. As a result, the current which flows through the collector-emitter path of transistor $T_9$ is proportional to the current which flows through the collector-emitter path of transistor $T_5$. With a correct ratio of the base-emitter areas of the transistors $T_5$, $T_6$, $T_7$ and $T_9$ and the diode $D_3$, which may take the form of a transistor connected as a diode, it is ensured that the difference of the collector currents of the transistors $T_8$ and $T_9$ is proportional to the current which flows through the output terminal 11. The collector currents of the transistors $T_8$ and $T_9$ may then be several times greater than the collector currents of the transistors $T_6$ and $T_5$. As the currents which flow through the collector emitter paths of the transistors $T_8$ and $T_9$ are proportional to the currents which flow through the collector-emitter paths of transistors $T_5$ and $T_6$, the use of the circuit arrangement according to the invention ensures that the quiescent current setting of the transistors $T_8$ and $T_9$ is also less dependent on the supply voltage and the temperature.

Owing to the use of the current mirror circuits for the quiescent current setting, when at low supply voltages the resistors $R_1$ and $R_2$ may have comparatively low resistance values, the amplifier according to the invention is suitable for forming part of a monolithic integrated circuit. The feedback output circuit which consists of the capacitor C and the variable resistor $R_3$ should then be provided externally. If desired, the resistors $R_1$ and/or $R_2$ may also be fitted externally.

The scope of the invention is not limited to the embodiments shown. As appears from the description, a multitude of embodiments is possible all of which, in a manner according to the invention, render the quiescent current setting of the output transistors of the push-pull amplifier supply-voltage independent to a greater extent.

What is claimed is:

1. A push-pull amplifier comprising first and second transistors of mutually opposite conductivity types having their collector-emitter paths connected in series between the terminals of an electric supply source and with their collectors in proximate facing relationship, an output terminal connected to the facing collectors of the first and the second transistor, a first resistor which interconnects the bases of the first and second transistor, and a quiescent-current control circuit which feeds a quiescent current through the first resistor so that the quiescent current through the first and the second transistor is determined by the quiescent current control circuit, said quiescent current control circuit comprising, a first and a second current mirror circuit each having at least one input circuit and one output circuit with at least one semiconductor junction in the output circuit shunted by at least one semiconductor junction in the input circuit so that the current which flows in the output circuit is in a fixed ratio n to the current which flows in the input circuit, a current branch circuit connected between the supply source terminals so as to apply to the first and second current mirror input circuits a bias current which varies with the supply voltage, said branch circuit comprising a second resistor and the semiconductor junctions of the input circuits of the current mirror circuits, means interconnecting the first and second current mirror output circuits via the first resistor, whereby the quiescent current through the first resistor varies with the supply voltage in a manner similar to the currents through said branch circuit, the value of the first resistor being selected relative to the elements included in said branch circuit so as to reduce variations of the quiescent currents through the first and the second transistor with variations of the supply voltage.

2. A push-pull amplifier as claimed in claim 1, characterized in that the value of the first resistor equals the quotient of the sum of the resistance value of the second resistor and the differential input impedances of the input circuits of the current mirror circuits divided by the current mirror ratio n between the output and the input currents of the current mirror circuits.

3. A push-pull amplifier as claimed in claim 1 wherein the first and the second current mirror circuits respectively include a third and a fourth transistor of a mutually opposite conductivity type with their base-emitter junctions shunted by a first and a second semiconductor junction respectively, the circuits formed by said semiconductor junctions being interconnected via said second resistor and forming the input circuits of the current mirror circuits, and the circuits formed by the collector-emitter paths of the third and the fourth transistor being the current mirror output circuits, the collector of the third transistor being connected to the base of the first transistor and the collector of the fourth transistor to the base of the second transistor.

4. A push-pull amplifier comprising, first and second voltage supply terminals, first and second transistors of opposite conductivity type serially connected between the first and second supply terminals to form a first branch circuit, an output terminal connected to a common junction between said first and second transistors, a first resistor connected to the base electrodes of said first and second transistors, first and second current mirror circuits each comprising a common terminal, an input terminal, an output terminal, a first semiconductor device connected between the common and output terminals and a semiconductor junction element connected between the common and input terminals and in shunt with a p-n junction of the first semiconductor device whereby the current in the output terminal has a fixed relationship to the current in the input terminal, means connecting the common terminals of said first and second current mirror circuits to said first and second supply terminals, respectively, means connecting the first resistor to the output terminals of the first and second current mirror circuits to form a second branch circuit across the supply terminals, and a second resistor connected to the input terminals of said first and second current mirror circuits to form a third branch circuit across the supply terminals, said first and second resistors being selected in a given relationship so that the quiescent currents flowing in the first and second transistors are substantially independent of the supply voltage.

5. An amplifier as claimed in claim 4 wherein said first and third branch circuits are connected in parallel across the supply terminals, said third branch circuit comprising the series connection of the two semiconductor junction elements and the second resistor and the first branch circuit comprising the series connection of the first and second transistors only.

6. An amplifier as claimed in claim 4 further comprising third and fourth transistors serially connected across the supply terminals, input means for coupling a signal to the base electrodes of the first and second transistors, and means coupling a common junction of said third and fourth transistors to said input means for coupling a feedback signal to the input means.

7. An amplifier as claimed in claim 6 wherein said feedback coupling means includes a capacitor and third resistor serially connected to said common junction of the third and fourth transistors.

8. An amplifier as claimed in claim 4 wherein for a current mirror ratio equal to unity, the resistance value of the first resistor is approximately 20% greater than the resistance value of the second resistor.

9. A push-pull amplifier comprising, first and second voltage supply terminals, first and second current mirror circuits each comprising a common terminal, an input terminal and an output terminal with said terminals interconnected by semiconductor elements so that the current at the output terminal is in a fixed ratio to the current at the input terminal, means connecting the common terminals of said first and second current mirror circuits to said first and second supply terminals, respectively, means connecting a first resistor to the output terminals of the first and second current mirror circuits to form a first branch circuit across the supply terminals, a second resistor connected to the input terminals of the first and second current mirror circuits to form a second branch circuit across the supply terminals, first and second transistors coupled to said supply terminals via a load impedance means, and means coupling the base electrodes of said first and second transistors to opposite terminals of said first resistor.

10. A push-pull amplifier as claimed in claim 9 wherein said coupling means includes a third transistor for coupling the second transistor base electrode to one terminal of the first resistor, said first transistor and a first part of said load impedance means being serially connected and in parallel with the series connection of the second transistor and a second part of the load impedance means between the supply terminals, and a signal input terminal connected to said first resistor.

* * * * *